Inventor
Y. OHASHI
By [signature]
Attorney

NON-LINEAR DIGITAL TO ANALOGUE CONVERTER

Filed April 6, 1964 2 Sheets-Sheet 2

Inventor
Y. OHASHI
By [signature]
Attorney

United States Patent Office 3,310,799

Patented Mar. 21, 1967

3,310,799

NON-LINEAR DIGITAL TO ANALOGUE CONVERTER

Yasutaka Ohashi, Shikoku-machi, Tokyo, Japan, assignor to Nippon Electric Company, Limited, Tokyo, Japan, a corporation of Japan Filed Apr. 6, 1964, Ser. No. 357,674
Claims priority, application Japan, Apr. 12, 1963, 38/18,975
12 Claims. (Cl. 340—347)

This invention relates to a non-linear pulse-code-modulation (PCM) decoder or digital-analogue converter and to a non-linear pulse-code-modulation encoder or analogue-digital converter of the feedback or similar type wherein the decoder or digital-analogue converter is used as the local decoder.

One prior art feedback encoder which is a type of serial encoder is disclosed in an article by B. D. Smith in the "Proceedings of the Institute of the Radio Engineering," volume 41, August 1953, pages 1053–1058. As disclosed in this article, it is possible to provide a feedback encoder with a companding characteristic which has an improved signal-to-noise ratio by furnishing the local decoder with a non-linear companding characteristic. However, it should be noted that this prior art encoder can only provide a hyperbolic companding characteristic given by:

$$y=x/[1+m(1-x)] \qquad (1)$$

where: $x$ is a normalized digital variable between 0 and 1; $y$ is the analogue quantity corresponding to the digital variable $x$; and $m$ is an arbitrary parameter. Furthermore, in said prior art encoder, the encoding characteristic is not given by an odd function and is not symmetric with respect to the zero point of the output digital or of the input analogue signal. Thus, for an analogue signal of that sort (such as the speech and the television signals), which has both positive and negative values, encoding must be performed separately for positive and negative values of the input analogue signal. Moreover, said prior art encoder introduces errors into the results of encoding at the neighborhood of the zero input analogue signal. Further disadvantages of said prior art encoder are: (a) there is only one parameter in the companding characteristic, and this improvement of the signal-to-quantization-noise ratio in the lower input signal level region results in deterioration of said ratio in the higher input signal level region; (b) selection of a large value (such as twenty) for the parameter $m$ in the Equation 1 which is required for encoding speech signals, results in reduction of the output analogue voltage of the local decoder; (c) the encoder is not adapted to high-speed operation, because said prior art encoder cannot use a current comparator for comparing the output analogue signal of the local decoder with the input analogue signal.

Figures 1, 2, 3:
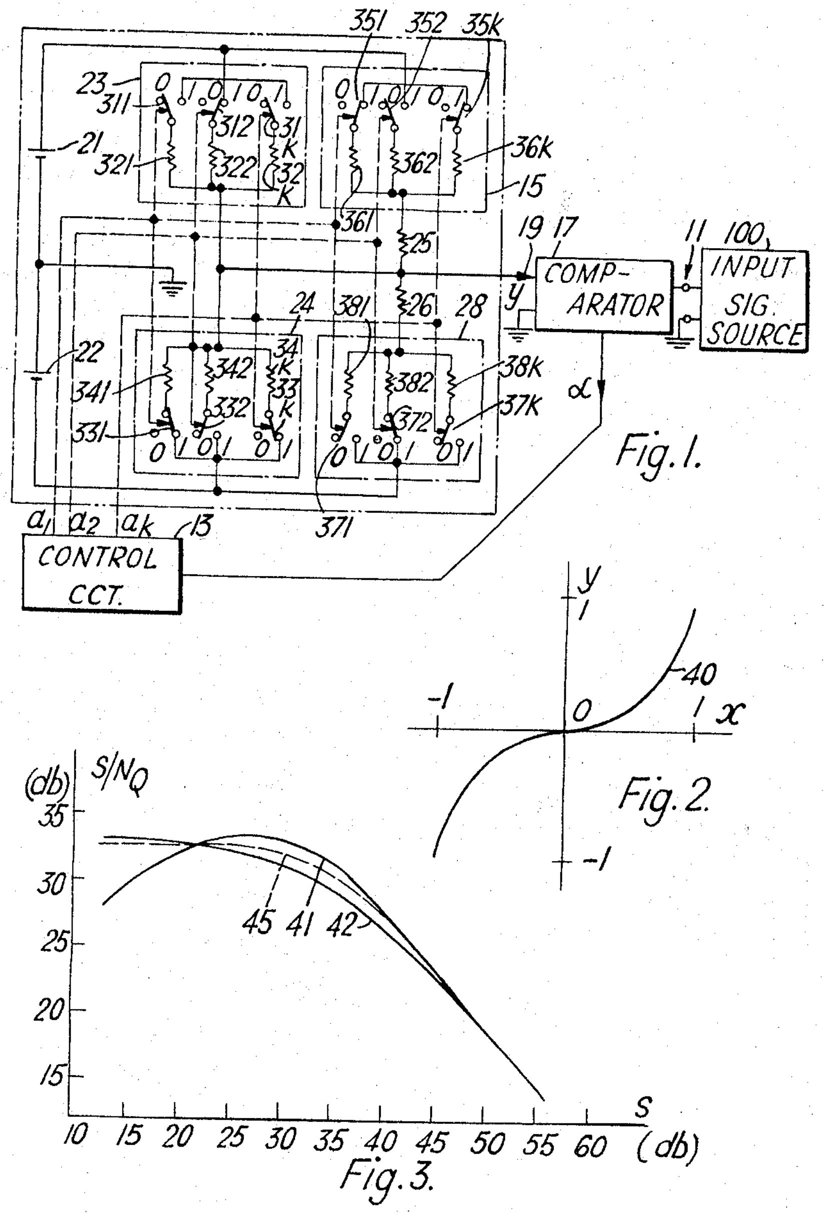

A non-linear compression characteristic for an encoder has hitherto been provided by the combination of an encoder having a linear encoding characteristic and a compander comprising a non-linear circuit element such as a vacuum tube, a diode, and a transistor. In this type conventional encoder, the non-linearities of the non-linear circuit elements vary on the temperature and the age of the components. Thus, the non-linear encoding characteristic is subject to temperature variation and other changes and different encoders or the same encoder with different non-linear circuit elements may have different non-linear encoding characteristics. Moreover, the use of transistors as the switching elements of the weighted-resistor-switch circuits of the prior art encoders (such as illustrated in FIG. 3 on page 1054 of said article cited above in the Proceedings of the Institute of Radio Engineering) introduced severe distortion into the non-linear encoding or decoding characteristic of a conventional encoder or decoder because of the temperature dependency and other changes of the transistor characteristics.

An object of the invention, therefore, is to provide a decoder-encoder whose non-linear characteristic is not dependent upon the non-linear characteristic of a non-linear circuit element and which has a non-linear characteristic which can be represented by an equation having two variable parameters.

Another object of the invention is to provide a decoder-encoder of the kind, which provides a good approximation of a logarithmic, a hyperbolic, a hyperbolic sine, or other companding characteristics by selecting particular values for the variable parameters.

Another object of the invention is to provide an encoder which has an encoding characteristic given by an odd function and which may consequently be adapted in and of itself to encode an input analogue signal which assumes both positive and negative values without need for a discriminator for the different polarities of the input analogue signal and therefore to precisely encode the input analogue signal even when the analogue signal has a near zero value.

Still another object of the invention is to provide an encoder having an improved signal-to-quantization-noise ratio for the lower input signal level region as well as for the higher input signal level region by adjusting the two parameters in the decoder or encoding characteristic.

A further object of the invention is to provide an encoder wherein the output analogue signal of the local decoder can be larger (when encoding the speech signal) than that obtainable with a conventional decoder and consequently it will be possible to perform encoding with high precision.

A still further object of the invention is to provide an encoder in which both a voltage comparator and a current comparator may be used and which is therefore adapted to high-speed encoding.

A further object of the invention is to provide a decoder or an encoder wherein even if transistors are used as the switching elements in the weighted-resistor-switch circuits, the decoding or the encoding characteristic will be able to withstand the effects caused by the dark current and the residual voltage of the transistors and will be stable regardless of temperature and other changes of the various characteristics of the transistors and whereby it is consequently possible to realize decoding or encoding with high precision and reproductibility.

According to the invention there are provided a decoder-encoder in which said decoder-encoder acts as the local decoder having a non-linear companding characteristic given by $$y=[\{1-p(1-x^2)\}/\{1+q(1-x^2)\}]x \qquad (2)$$

where: $x$ is a normalized digital variable which assumes values between $-1$ and 1, inclusive; $y$ is a normalized analogue quantity corresponding to the digital variable $x$; and $p$ and $q$ are independently variable parameters. With an encoder of the invention it is possible (because the parameters of the non-linear characteristic can be set at a nearly unity value, which value is suitable for encoding an analogue signal which assumes both positive and negative values like the speech and the television signals) to markedly raise the precision of the encoding and to obtain more than ten times as large an output analogue signal of the local decoder than that attainable by a conventional decoder.

According to an aspect of the invention a decoder which can provide for the decoding characteristic given by the Equation 2, includes four parallel-type weighted-resistor-switch circuits along with a first and a second direct-current power source for providing positive and negative voltages of substantially the same value, and non-linear resistors of substantially the same resistance characteristics. A first and a second of said weighted-resistor-switch circuits are connected to the first and the second direct-current power sources, respectively, and are made equivalent and complementary to each other in a manner to be explained in conjunction with the specific embodiments of the invention. The third and a fourth weighted-resistor-switch circuits are connected at their corresponding ends, to the first and the second direct-current power sources, respectively, and are also connected at their other ends to said non-linear resistors, respectively. Furthermore, said third and fourth resistor switch circuits are not only equivalent and complementary to each other but are also respectively equivalent to the weighted-resistor-switch circuit connected to the same power source (for example, the third switch to the first switch).

Figures 5, 6:
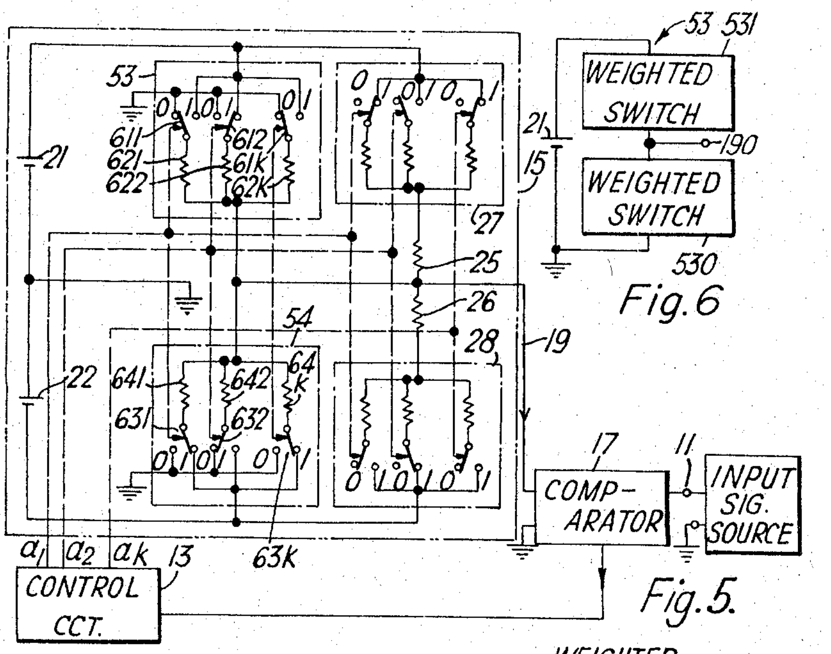
Figure 4:
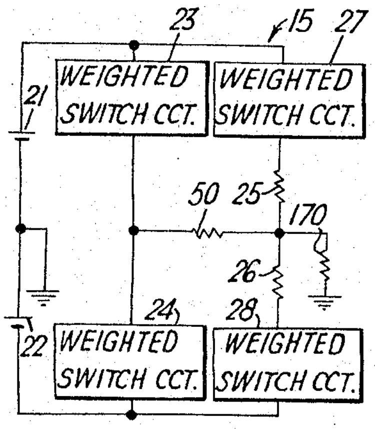

The above-mentioned and other features and objects of this invention and the means of attaining them will become more apparent and the invention itself will be best understood by reference to the following description of embodiments of the invention taken in conjunction with the accompanying drawings in which:

FIG. 1 is a circuit diagram, shown partly in block form of one embodiment of the encoder of the invention, FIG. 2 is a graph which illustrates the normalized expanding characteristic of a decoder according to the invention, FIG. 3 is a graph which shows the improved signal-to-noise ratios obtained by use of the invention, FIG. 4 is a block diagram of a modification of the embodiment shown in FIG. 1, FIG. 5 is a circuit diagram partly in block form of another embodiment of an encoder according to this invention.

Figure 7:
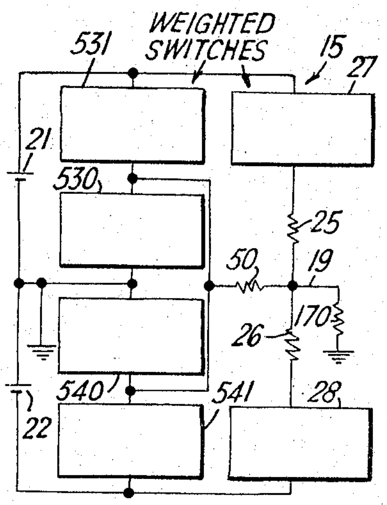

FIG. 6 is a block diagram showing an equivalent circuit of a weighted-resistor-switch circuit used in the embodiment shown in FIG. 5, and FIG. 7 is a block diagram of a modification of the embodiment shown in FIG. 5.

Referring to FIG. 1, there is illustrated therein an encoder having a current comparator. The comparator of the encoder of FIG. 1 is similar to the one illustrated in FIG. 4 on page 1054 of the above-cited article in the Proceedings of the Institute of Radio Engineering except that the comparator is a current comparator. In FIG. 1 an analogue signal input terminal pair 11 is connected to receive an input analogue signal (to be converted to a digital signal) from source 100. A control circuit 13 is provided for producing control signals $a_1, a_2, \ldots,$ and $a_k$, $k$ in number, which corresponds (at the beginning of a sampling time interval) to a predetermined $k$-digit digital code and which are produced at the successive time sampling points for producing a digital output code representing successively the sampled input analogue signal. A local decoder 15 is also provided for producing in response to any one set of the control signal $a_1, a_2, \ldots,$ and $a_k$ an output analogue signal corresponding to the digital codes. A current comparator 17 is provided for comparing at each of the successive time points the output analogue signal $y$ and the input analogue signal to produce an error signal $d$ that indicates which one is the larger of the two and which is fed to the control circuit 13 to control the beginning of the predetermined digital code as well as the successive time points of the succeeding digital codes. Although the arrangement shown in FIG. 1 illustrates that one of the analogue signal input terminal pair 11 is grounded and that one input terminal of comparator 17 for receiving the output analogue signal $y$ of the local decoder 15 is also grounded, it should be recognized that ground may be replaced by a given reference potential.

According to the invention the local decoder 15 comprises a first and a second serially connected direct-current power source 21 and 22 each of which is adapted to provide a substantially direct-current predetermined voltage E. An intermediate point between said sources is connected to ground or a point of reference potential. One lead of a first and a second parallel type weighted-resistor-switch circuit 23 and 24 (which are equivalent and complementary to each other) are respectively connected to different ends of the series-connected direct-current power sources 21 and 22. The other lead of circuits 23 and 23 is connected to lead 19. A lead wire of a third and a fourth parallel type weighted-resistor-switch circuit 27 and 28 is respectively connected to different ends of the series-connected direct-current power source 21 and 22, respectively. Said resistors have substantially the same resistance $R_0$ for providing a non-linearity to the decoding characteristic of the local decoder 15. The third weighted-resistor-switch circuit 27 is selected to be complementary to the first weighted-resistor-switch circuit 23. Switch circuits 23 and 27 are both connected to the positive terminal of a power source 21. The fourth weighted-resistor-switch circuit 27 is selected to be complementary to the second weighted-resistor-switch circuit 24 and both are connected to the negative terminal of power source 22 and consequently switch 28 is also complementary to and equivalent to the third weighted-resistor-switch circuit 27.

The first weighted-resistor-switch circuit 23 comprises switches 311, 312, . . ., and 31$k$ each of which has a "zero" contact 0 and a "one" contact 1 connected to the first direct-current power source 21. Said switches are adapted to be switched between the "zero" contact 0 and the "one" contact 1 in accordance with the corresponding one of the control signals $a_1, a_2, \ldots,$ and $a_k$ supplied from the control circuit 13 is a digit code corresponding to the binary 0 and a digit corresponding to the binary 1. The weighted resistors 321, 322, . . ., and 32$k$ are each connected at one end to the switches 311, 312, . . ., and 31$k$, respectively, and at the other ends to the lead 19. These weighted resistors have weighted resistances, respectively, ranging stepwise from resistance $R_1$ (which is the first resistor 321 connected to the first switch 311 controlled by the control signal $a_1$ of the lowest digit), through $R_1/2$, $R_1/2^2$, . . ., and $R_1/2^{k-2}$, to $R_1/2^{k-1}$. The second weighted-resistor-switch circuit 24 likewise comprises switches 331, 332, . . ., and 33$k$ and weighted resistors 341, 342, . . ., and 34$k$. According to the invention the first and the second weighted-resistor-switch circuits 23 and 24 are equivalent to each other in that complete correspondence exists between their respective connections leading from the power sources through the switches and the weighted resistors to the common lead 19. Also equal resistance is given to each pair of the corresponding resistors 321 and 341 (or the like) and are complementary to each other in that when each of the control signals $a_1, a_2, \ldots, a_k$ is either a digit code corresponding to the binary zero or one corresponding to the binary one, then the corresponding one of the switches 311, 312, . . ., and 31$k$ of the first weighted-resistor-switch circuit 23 makes either its "zero" contact 0 or its "one" contact 1 while the corresponding one of the switches 331, 332, . . ., and 33$k$ of the second weighted-resistor-switch circuit 24 makes either its "one" contact 1 or its "zero" contact 0. Alternatively, the first and the second weighted-resistor-switch circuits 23 and 24 may be made complementary to each other, not by arranging the manner of inter-switching of the switch pair 311 and 331 and the like by the control signals $a_1, a_2, \ldots,$ and $a_k$ as above, but instead by arranging the switch pair in such a manner that either the "zero" contacts 0 or the "one" contacts 1 of each switch pair are both closed in accordance with whether the corresponding control output signals $a_1, a_2, \ldots,$ and $a_k$ is a digit code corresponding either to the binary zero or the binary one. Furthermore, all the "one" contacts of the first weighted-resistor-switch circuit 23 are connected to the first power source 21 while all the "zero" contacts of the second weighted-resistor-switch circuit 24 are connected to the second power source 22.

The third weighted-resistor-switch circuit 27 comprises switches 351, 352, . . ., and 35$k$. Each switch in turn comprises switches 351, 352, . . ., and 35$k$. Each switch in turn comprises a "zero" contact 0 or all the "one" contacts 1 being connected to the first power source 21 so that these switches may operate in a manner complementary to the switches 311, 312, . . ., and 31$k$ to the first weighted-resistor-switch circuit 23. Each switch is controlled by the control signals $a_1$, $a_2$, . . ., and $a_k$ derived from the control circuit 13, and weighted resistors 361, 362, . . ., 36$k$ each of which is respectively connected at one end to the switches 351, 352, . . ., and 35$k$ respectively, and at their other end to the non-linear resistor 25. The weighted resistors are provided with weighted resistances $R_2$, $R_2/2$, . . ., and $R_2/2^{k-1}$, respectively. The resistance $R_2$ is given to the resistor 361 connected to the switch 351 which is controlled by the control signal $a_1$ corresponding to the lowest-digit digit code. The fourth weighted-resistor-switch circuit 28 comprises switches 371, 372, . . ., and 37$k$ which are arranged to be complementary with respect to the switches 351, 352, . . ., and 35$k$ in the third weighted-resistor-switch circuit 27. The weighted resistors 381, 382, . . ., and 38$k$ are respectively serially connected between switches 371, 372, 37$k$ (in an equivalent manner with respect to the weighted resistors 361, 362, . . ., and 36$k$ in the third weighted resistor-switch circuit 27 and are consequently provided with weighted resistances $R_2$, $R_2/2$, . . ., and $R_2/2^{k-1}$, respectively) and the non-linear resistor 26.

Although the switches 311, 331, 351, 371, 312, and so on of the weighted-resistor-switch circuits 23, 24, 27, and 28 are shown in FIG. 1 as mechanical switches, they may in fact for practical use, be electronic switches such as transistors.

The manner of providing the local decoder 15 with a non-linear characteristic given by the Equation 2 will now be described in conjunction with a case where all the "one" contacts 1 of all the weighted-resistor-switch circuits 23, 24, 27, and 28 are connected to the respective power sources 21 and 22 in the manner shown in FIG. 1.

If the first and the fourth weighted-resistor-switch circuits 23 and 28 have admittances $G_1$ and $G_2$, respectively, when the digit codes, $k$ in number, are all binary one, then the second and the third weighted-resistor-switch circuits 24 and 27 will also have admittances $G_1$ and $G_2$, respectively, when the $k$ digit codes are all binary zero as follows:

$$G_1=(2^k-1)/R_1$$
$$G_2=(2^k-1)/R_2 \quad (3)$$

It is to be noted that the resistances have been selected for the respective weighted resistors 321, 341, 361, 381, 322, 342, 362, 382, . . ., 32$k$, 34$k$, 36$k$ and 38$k$ in the manner mentioned above. Therefore, for the control signals $a_1$, $a_2$, . . ., and $a_k$ which are applied to all of the weighted-resistor-switch circuits 23, 24, 27 and 28 (which correspond to the digit codes, $k$ in number, respectively, representing in combination a normalized digital variable $x$ in the Equation 2), the first, the second, the third, and the fourth weighted-resistor-switch circuits 23, 24, 27, and 28 have admittances $g_1$, $g_2$, $g_3$, and $g_4$ as follows:

$$g_1=G_1\cdot(1-x)/2$$
$$g_2=G_1\cdot(1+x)/2$$
$$g_3=G_2\cdot(1+x)/2 \quad (4)$$
$$g_4=G_2\cdot(1-x)/2$$

If the potential of the mentioned wiring 19 at a given moment is E′, then $$(E-E')[g_1+1/(R_0-1/g_3)]+(-E-E')\times[g_2+1/(R_0-1/g_4)]-E'/r=0 \quad (5)$$

is the circuit equation for the circuit comprising the local decoder 15 and an equivalent circuit $r$ of the non-linear input impedance of the comparator 17 as may generally be non-linear. From the circuit Equation 5 it will be seen that the potential E′ of the wiring 19 is given by $$E'=E\cdot(Ax+Bx^3)/(C-Dx^2) \quad (6)$$

where the coefficients A, B, C, and D are given by $$A=4G_2-G_1(2+R_0G_2)^2$$
$$B=R_0^2G_1G_2^2$$
$$C=(1/r+G_1)(2+R_0G_2)^2+2G_2(2+R_0G_2) \quad (7)$$
$$D=(1/r+G_1)R_0^2G_2^2+2R_0G_2^2$$

If the normalized output level $y$ represents the output level of the local decoder 15 and is obtained by multiplying the voltage E′ of lead 19 with $(C-D)/E(A+B)$ (so that the voltage E′ may be represented by $-1$ and $+1$ when the normalized digital variable $x$ is $-1$ and $+1$ respectively) then the Equation 6 becomes $$y=([1-\{B/(A+B)\}(1-x^2)]/[1+\{D/(C-D)\}(1-x^2)])x \quad (8)$$

Thus, if the coefficients A, B, C, and D are so selected that they satisfy $$B/(A+B)=p$$
$$D/(C-D)=q \quad (9)$$

then Equation 8 coincides with Equation 2. Consequently it is possible with the decoder 15 to obtain the decoding characteristic given by the Equasion 2.

When the values of the independent parameters $p$ and $q$ in Equation 2 are both given, Equation 9 will provide the ratios between the coefficients A and B, and C and D. The common voltage E of the direct-current power source 21 and 22 is determined by the voltages handling capacitors of the transistors, if transistors are used as the switches 311, 331, 351, 371, 312 (and so on) in the weighted-resistor-switch circuits. The equivalent resistance $r$ of the input impedance of the comparator 17 depends on the type of the comparator. Thus the ratio of the maximum resistance $R_1$ (among the resistances of the weighted resistors 321, 341, 322, 342) and the common resistance $R_0$ of the non-linear resistors 25 and 26 and the ratio of the maximum resistance $R_2$ of the resistances of the weighted resistors 361, 381, 362, 382 (etc.), and the common resistance $R_0$ are determined by the Equations 3 and 7. On the other hand, the resistances $R_1$ and $R_2$ are determined according to the characteristics of the switching transistors. Consequently, the resistances $R_0$, $R_1$, and $R_2$ are all determined.

Referring to the graph of FIG. 2 in which the abscissa axis is scaled to the normalized input digital variable $x$ and the ordinate axis is scaled to the normalized output analogue quantity $y$, a smooth curve 40 illustrates the decoding characteristic of the local decoder 15 having the parameters $p$ and $q$ in Equation 2 set at 0.9 and 0.8, respectively. Each of the positive and the negative branches of the decoding characteristic is in good approximation to that logarithmic characteristic disclosed in a paper by H. Mann, H. M. Straube, and C. P. Villars in the "Bell System Technical Journal," volume 41 (January 1962), pages 173–226 in which 100 is selected as the constant showing the degree of compression and is represented by the Greek letter "mu."

Referring to the graph of FIG. 3 in which the abscissa axis is scaled in db for values of the difference $s$ between the input signal level and the overload level and the ordinate axis is scaled in db, to the signal-to-quantization-noise ratio $S/N_Q$. As indicated in FIG. 4 on page 179 of the above-mentioned paper in the Bell System Technical Journal, curves 41 and 42 are plotted, respectively, for the encoder with a hyperbolic encoding characteristic (indicated in the previously mentioned paper by B. D. Smith in the Proceedings of the Institute of Radio Engineering) and a conventional encoder composed of an encoder with a linear characteristic and a compander with a logarithmic companding characteristic and thus provided, in combination, with a logarithmic encoding characteristic wherein the constant "mu" is 100. In FIG. 3 the dotted curve 45 shows the characteristic of the encoder of FIG. 1 wherein the parameters $p$ and $q$ in the Equation 2 are set at 0.9 and 1.3 respectively. The signal-to-quantization-noise ratio of curve 41 is superior to that of curve 42 in the lower input level region but suddenly becomes worse at a somewhat higher input level. In contrast to both, the signal-to-quantization-noise ratio curve 45 of the encoder of the invention is ideally flat.

If the parameters $p$ and $q$ in the Equation 2 are set at 0.9 and 0.8, respectively, then a value as small as four is a sufficient ratio between the reciprocal of the maximum admittance $G_2$ of the third or the fourth weighted-resistor-switch circuit 27 or 28 and the resistance $R_0$ of the non-linear resistors 25 or 26. The fact that such a small ratio is possible is one of the technical advantages obtained by providing in the invention the local decoder 15 with two pairs of the weighted-resistor-switch circuits 23, 24, 27 and 28, each pair consisting of complementary weighted-resistor-switch circuits. In prior art systems the ratio must be as large as eighty to obtain a substantially equivalent characteristic with only one pair of complementary weighted-resistor-switch circuits 27 and 28. Inasmuch as it is thus possible according to this invention to reduce the ratio and accordingly the resistance $R_0$ of the non-linear resistors 25 or 26, it is possible, on the one hand, to make the maximum value of the electric current flowing through the weighted resistors 321, 341, 361, 381 (etc. about twenty times as large as that permitted in case there is only one pair of the complementary weighted-resistor-switch circuits). This greatly reduces (when transistors are used in the switches 311, 331, 351, 371, etc. of the weighted-resistor-switch circuits), the effect of the temperature and other similar changes on the dark current $I_{00}$, and remarkably enhances the precision of the decoders and the encoders of the invention. This also permits the output current of the local decoder 15 to increase to a value about ten times as large as that achieved when the parameter is only one, and thus raises the precision of the local decoder 15 while simplifying the designing thereof. Furthermore, it is possible, on the other hand, to increase the voltage applied across the weighted resistors 321, 341, 361, 381, etc. and to thereby remarkably reduce the adverse effect caused by the residual voltage of the switching transistors. This also markedly enhances the precision of the decoders and the encoders of the invention.

Referring now to FIG. 4 there is illustrated therein a modification of the device of FIG. 1. In FIG. 4, a local decoder 15 of an encoder is adapted for use with a voltage comparator. Decoder 15 is similar to that of FIG. 1 and also includes a decoupling resistor 50 which is interconnected between the common juncture formed by the first, the second weighted-resistor-switch circuits 23 and 24 and another juncture formed by the non-linear resistors 25 and 26. Incidentally, the input impedance of the voltage comparator on the side of the local decoder 15 is illustrated in FIG. 4 by a resistor 170. The resistance of the decoupling resistor 50 may be determined by solving (under given condition) the equation (which holds for the circuit including the local decoder 15 and the input impedance 170 of the comparator) such as Equation 5.

Referring to FIG. 5, there is illustrated therein a second embodiment of the invention. In FIG. 5 the first and the second parallel-type weighted-resistor-switch circuits 23 and 24 of the local decoder 15 in the embodiment of FIG. 1 (wherein a current comparator is used) are replaced by a pair of voltage-linear-type weighted-resistor-switch circuits 53 and 54 (which is similar to the circuit illustrated in FIG. 3 page 1054 of the previously cited article in the Proceedings of the Institute of Radio Engineering). The first weighted-resistor-switch circuit 53 is connected to the positive terminal of the first direct-current power source 21. Circuit 53 comprises switches 611, 612, . . . , 61$k$ each of which has a "zero" contact 0 connected to the other terminal of the first direct-current power source 21 (shown in the figure as grounded), and a "one" contact 1 connected to the above-mentioned positive terminal and each of which is interswitchable between the "zero" contact 0 and the "one" contact 1 in accordance with whether the corresponding control signals $a_1, a_2, \ldots,$ and $a_k$ delivered from the control circuit 13 is a digit code corresponding to the binary 0 and one corresponding to the binary 1. The weighted resistors 621, 622, . . . , and 62$k$ are respectively serially connected between the switches 611, 612, . . . , and 61$k$, and the lead 19. These resistors are provided with weighted resistances $R_1$, $R_1/2, \ldots,$ and $R_1/2^{k-1}$, respectively. The resistance $R_1$ is given to the resistor 621 connected to the switch 611 controlled by the output signal $a_1$ corresponding to the lowest-digit digit code. The second weighted-resistor-switch circuit 54 comprises switches 631, 632, . . . , and 63$k$ and weighted resistors 641, 642, . . . , and 64$k$ and is made equivalent and complementary to the first weighted-resistor-switch circuit 53.

Referring to FIG. 6 there is illustrated therein a modification of the circuit of FIG. 5. In FIG. 6, the equivalent circuit of a first voltage-series-type weighted-resistor-switch circuit 53 comprises a series connection of weighted-resistor admittance circuits 531 and 530 connected across the first direct-current power source 21 shown in FIG. 5 and an output terminal 190 connected to the point of interconnection between the weighted-resistor admittance circuits 531 and 530. The output terminal 190 is connected to the lead 19. The admittance $G_1$ which the weighted-resistor-switch circuit 53 presents between the both ends of the direct-current power source 21, and the wiring 19, does not vary with the closing of either the "zero" contact 0 and the "one" contact 1 in each of the switches 611, 612, . . . , and 61$k$, for such an admittance $G_1$ may be given as follows:

$$G_1=(2^k-1)/R_1 \qquad (3')$$

On the other hand, the weighted-resistor admittance $g_0$ of the weighted-resistor admittance circuit 530 (which is connected at one end thereof to the negative grounded terminal of the direct-current power source 21) and the weighted-resistor admittance $g_1$ of the other weighted-resistor admittance circuit 531 is given by $$g_0=G_1\cdot(1-x)/2$$

and $$g_1=G_1\cdot(1+x)/2 \qquad (4')$$

respectively, for the normalized digital variable $x$ given in the Equation 4.

The second embodiment shown in FIG. 5 has all the technical advantages mentioned in conjunction with the first embodiment of FIG. 1. Additionally, since the current flowing through the switches 611, 631, 612, 632, . . . , 61$k$, and 63$k$ need not be completely cut off in the voltage-series-type weighted-resistor-switch circuit 53 or 54 when the contacts are closed in each of the switches it is possible to use diodes switches in place of transistor switches. Therefore, the switches can be composed of the same number of transistors as a conventional non-linear encoder having only one parameter, with addition of circuits comprising resistors and diodes.

Referring finally to FIG. 7, there is illustrated another modification of the circuit of FIG. 6. In FIG. 7 a local decoder 15 is illustrated which is the equivalent circuit of the voltage-linear-type weighted-resistor-switch circuit shown in FIG. 6 and which is a modification for use with a voltage comparator. In FIG. 7 the first and the second parallel-type weighted-resistor-switch circuits 23 and 24 in the local decoder 15 shown in FIG. 4 are replaced by a first voltage-linear-type weighted-resistor-switch circuit illustrated by the equivalent blocks 530 and 531 and a second voltage-linear-type weighted-resistor-switch circuit shown also by the equivalent blocks 540 and 541.

In the local decoder 15 of FIGS. 5 and 7, the common voltage of the direct-current power sources 21 and 22, the resistances of the weighted resistors 621, 641, 622, 642, etc. of the voltage-linear-type weighted-resistor-switch circuits, the resistances of the weighted resistors of the parallel-type weighted-resistor-switch circuits 27 and 28, the common resistance of the non-linearity-giving resistors 25 and 26, the resistance of the decoupling resistor 50, etc., are determined by solving (under given conditions) a circuit equation like the Equation 5 which holds for the circuit including the local decoder 15 and vention in connection with specific embodiments, it is to While I have described above the principles of my in- the input impedance 170 of the comparator.
be clearly understood that this description is made only by way of example, and not as a limitation to the scope of my invention as set forth in the objects thereof and in the accompanying claims.

What is claimed is:

1. A device for converting a coded input signal into a non-linearly companded output signal comprising:

(A) a pair of sources of substantially constant potential serially connected to each other;

(B) first and second parallel networks connected across said serially connected sources, (1) said first parallel network including a first and a second weighted resistor switch-circuit serially connected to each other, said switch circuits being equivalent to each other but operating in a complementary manner to each other, (2) said second parallel network including a third and a fourth weighted resistor switch-circuit and a pair of non-linear resistors connected to each other such that the pair of resistors are serially connected between said third and fourth weighted switches, said third and fourth switch circuits also being equivalent and operating complementary to each other, (3) the weighted resistor switch circuits of each of said networks which are connected to receive the same output potential from said sources being selected to operate complementary to each other;

(C) coded input signal means connected to each of said weighted resistor switch circuits for controlling the switching of each of said switches in response to the code contained in said signals; and (D) output signal deriving means connected to a point between said first and second switch circuits in the first parallel network and to a point between said pair of non-linear resistors in said second parallel network for deriving a companded output signal.

2. A device as set forth in claim 1 wherein both of said sources generate the same voltage and wherein both said non-linear resistors have substantially the same resistance characteristics.

3. A device as set forth in claim 1 wherein the coded input signal means includes a source of coded input signals, a comparator connected to receive and compare said coded input signals and said companded output signals, said comparator producing an error signal in response to said comparison for adjusting the time poistion of the coded signals applied to said weighted switch circuits.

4. A device as set forth in claim 3 wherein said comparator compares the current characteristic of said coded input signals with the current characteristic of said output signals.

5. A device as set forth in claim 4 wherein each of the weighted resistors switch circuits comprises a plurality of switch means connected in parallel.

6. A device as set forth in claim 5 wherein the output signal deriving means includes a decoupling resistor having a fixed resistance connected between said points in the first and second parallel network.

7. A device as set forth in claim 3 wherein said comparator compares the voltage characteristics of the coded input signals with the voltage characteristic of said output signals and wherein the weighted resistor switch circuits comprise a plurality of parallel connected switch means.

8. A device as set forth in claim 7 wherein the switch means in said first and second weighted resistor switch circuits are devices having a first and second terminal and a third output terminal, and wherein means are provided for connecting the first terminal of all the switch means of said first weighted resistor switch circuit to a reference potential which is substantially equal to the potential between said series connected sources, and wherein means are provided for connecting the second terminal of all the switch means of said second weighted resistor switch circuit to said reference potential and wherein the third and fourth weighted resistor switch circuit each include a plurality of switch means connected in parallel.

9. A device as set forth in claim 8 wherein said reference potential is ground potential.

10. A device as set forth in claim 8 wherein the output deriving means includes a decoupling resistor having a fixed resistance connected between said point in said first and second parallel networks from which the companded output signal is derived.

11. A device as set forth in claim 7 wherein the coded input signal means supplies analogue signals and said switches are controlled to convert said input signals to digital output signals.

12. A device as set forth in claim 1 wherein the coded input signal means supplies digital signals and said switches are controlled to convert said input signals to analogue output signals.

No references cited.

MAYNARD R. WILBUR, *Primary Examiner.*

W. J. KOPACZ, *Assistant Examiner.*